(12) United States Patent
Adetutu et al.

(10) Patent No.: US 8,659,087 B2
(45) Date of Patent: Feb. 25, 2014

(54) ELECTRONIC DEVICE WITH A GATE ELECTRODE HAVING AT LEAST TWO PORTIONS

(75) Inventors: Olubunmi O. Adetutu, Austin, TX (US); Tien Ying Luo, Austin, TX (US); Narayanan C. Ramani, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 474 days.

(21) Appl. No.: 12/639,394

(22) Filed: Dec. 16, 2009

(65) Prior Publication Data

US 2010/0090287 A1    Apr. 15, 2010

Related U.S. Application Data

(62) Division of application No. 11/237,346, filed on Sep. 27, 2005, now Pat. No. 7,651,935.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |

(52) U.S. Cl.
USPC .......................................... 257/368; 257/388

(58) Field of Classification Search
USPC ..................... 257/368, 410, E27.06, E29.162
See application file for complete search history.

(56) References Cited

U.S. PATENT DOCUMENTS

| | | |
|---|---|---|
| 4,605,947 A | 8/1986 | Price et al. |
| 5,200,351 A | 4/1993 | Hadjizadeh-Amini |
| 5,849,616 A | 12/1998 | Ogoh |
| 5,960,270 A | 9/1999 | Misra et al. |
| 5,970,330 A | 10/1999 | Buynoski |
| 6,444,512 B1 | 9/2002 | Madhukar et al. |
| 6,506,642 B1 | 1/2003 | Luning et al. |
| 6,620,713 B2 | 9/2003 | Arghavani et al. |
| 6,750,519 B2 | 6/2004 | Lin et al. |
| 6,770,521 B2 | 8/2004 | Visokay et al. |
| 6,864,135 B2 | 3/2005 | Grudowski et al. |
| 6,891,233 B2 | 5/2005 | Lin et al. |
| 6,897,095 B1 | 5/2005 | Adetutu et al. |
| 6,902,971 B2 | 6/2005 | Grudowski |
| 6,933,565 B2 | 8/2005 | Matsumoto et al. |
| 6,936,508 B2 | 8/2005 | Visokay et al. |
| 6,982,465 B2 | 1/2006 | Kumagai et al. |
| 7,033,888 B2 | 4/2006 | Pan et al. |
| 7,081,656 B2 | 7/2006 | Eppich et al. |
| 7,105,394 B2 | 9/2006 | Hachimine et al. |
| 7,279,746 B2 | 10/2007 | Doris et al. |
| 7,316,960 B2 | 1/2008 | Ting |

(Continued)

FOREIGN PATENT DOCUMENTS

WO    2004049406 A1    6/2004

OTHER PUBLICATIONS

U.S. Appl. No. 11/258,781, Office Action mailed Apr. 14, 2008.
U.S. Appl. No. 11/148,455, Advisory Action mailed Apr. 28, 2008.

(Continued)

*Primary Examiner* — Cuong Q Nguyen

(57) ABSTRACT

A transistor structure of an electronic device can include a gate dielectric layer and a gate electrode. The gate electrode can have a surface portion between the gate dielectric layer and the rest of the gate electrode. The surface portion can be formed such that another portion of the gate electrode primarily sets the effective work function in the finished transistor structure.

20 Claims, 3 Drawing Sheets

(56) References Cited

U.S. PATENT DOCUMENTS

| | | | |
|---|---|---|---|
| 7,332,433 | B2 | 2/2008 | Choi et al. |
| 7,374,987 | B2 | 5/2008 | Chidambarrao et al. |
| 7,868,389 | B2 | 1/2011 | Adetutu et al. |
| 2004/0014306 | A1 | 1/2004 | Komatsu |
| 2004/0106249 | A1 | 6/2004 | Huotari |
| 2004/0262784 | A1 | 12/2004 | Doris et al. |
| 2005/0020022 | A1 | 1/2005 | Grudowski |
| 2005/0040461 | A1 | 2/2005 | Ono et al. |
| 2006/0234433 | A1 | 10/2006 | Luan et al. |
| 2006/0249794 | A1 | 11/2006 | Teh et al. |
| 2006/0281240 | A1 | 12/2006 | Grudowski et al. |
| 2007/0018259 | A1 | 1/2007 | Ko et al. |
| 2007/0051312 | A1 | 3/2007 | Sneh |
| 2007/0090455 | A1 | 4/2007 | Lim et al. |

OTHER PUBLICATIONS

U.S. Appl. No. 11/148,455, Office Action mailed Feb. 19, 2008.
U.S. Appl. No. 11/148,455, Office Action mailed Sep. 10, 2007.
U.S. Appl. No. 11/046,079, Notice of Allowance mailed Aug. 24, 2007.
U.S. Appl. No. 11/046,079, Office Action mailed Apr. 11, 2007.
Ranade, et al., "Work Function Engineering of Molybdenum Gate Electrodes by Nitrogen Implantation," Electrochemical and Sold-State Letters, The Electrochemical Society, Inc., 2001, pp. G85-G87, University of California at Berkeley, California.
Ha, et al., "Molybdenum Gate Work Function Engineering for Ultra-Thin-Body Silicon-on-Insulator (UTB SOI) MOSFETs," Jpn. J. Appl. Phys., Apr. 2003, pp. 1979-1982, vol. 42, Part 1, No. 4B.
Polishchuk, et al., "Dual Work Function Metal Gate CMOS Transistors by Ni-Ti Interdiffusion," IEEE Electron Device Letters, Apr. 2002, pp. 201-202, vol. 23, No. 4.
Choi, C., et al. "Aggressively Scaled UltraThin Undoped HfO2 Gate Dielectric (EOT < 0.7 nm) With TaN Gate Electrode Using Engineered Interface Layer," IEEE Electron Device Letters, v. 26, No. 7, Jul. 2005, pp. 454-457.
Misra, V., et al. "Electrical Properties of Ru-Based Alloy Gate Electrodes for Dual Metal Gate Si-CMOS," IEEE Electron Device Letters, v. 23, No. 6, Jun. 2002, pp. 354-356.
Senzaki, Y., et al. "Atomic Layer Deposition of High-k Dielectric and Metal Gate Stacks for MOS Devices," International Conference on Characterization and Metrology for ULSI Tehcnology, Mar. 15-18, 2005, SEMATECH Presentation, 35 pages.
Silicon Nano Device Laboratory, Department of Electrical & Computer Engineering, National Uiversity of Singapore, May 2004 Presentation, 60 pages.
U.S. Appl. No. 11/046,079, filed Jan. 28, 2005.
Pidin et al. "A Novel Strain Enhanced CMOS Architecture using Selectively Deposited High Tensile and High Compressive Silicon Nitride Films," IEDM 2004, pp. 1-4.
Yang et al. "Dual Stress Liner for High Performance sub-45nm Gate Length SOI CMOS Manufacturing," IEDM 2004, pp. 1-4.
Non-Final Office Action mailed Jul. 22, 2009 for U.S. Appl. No. 11/928,314, filed Oct. 30, 2007, 15 pages.
Notice of Allowance mailed Sep. 16, 2010 for U.S. Appl. No. 11/928,314, filed Oct. 30, 2007, 8 pages.
Notice of Allowance mailed Jul. 28, 2008 for U.S. Appl. No. 11/148,455, filed Jun. 9, 2005, 12 pages.
Final Office Action mailed Oct. 15, 2008 for U.S. Appl. No. 11/258,781, filed Oct. 26, 2005, 16 pages.
Notice of Allowance mailed Dec. 29, 2008 for U.S. Appl. No. 11/258,781, filed Oct. 26, 2005, 12 pages.
PCT International Search Report mailed Aug. 15, 2007 for PCT/US06/34771, 1 page.

ELECTRONIC DEVICE WITH A GATE ELECTRODE HAVING AT LEAST TWO PORTIONS

RELATED APPLICATION

This is a divisional application of and claims priority under 35 U.S.C. §120 to U.S. patent application Ser. No. 11/237,346 entitled "Electronic Device with a Gate Electrode Having at Least Two Portions and a Process for Forming the Electronic Device" by Adetutu et al., filed Sep. 27, 2005, which is assigned to the current assignee hereof and incorporated herein by reference in its entirety.

BACKGROUND

1. Field of the Disclosure

The present disclosure relates to electronic devices and processes, and more particularly to electronic devices comprising gate electrodes including at least two portions.

2. Description of the Related Art

State-of-the-art semiconductor devices can include transistors having a gate dielectric layer with one or more high dielectric constant ("high-k") materials. These materials typically have a dielectric constant higher than the silicon nitride, which is approximately 7.8. An exemplary high-k gate dielectric material can include one or more oxides of Group 3, 4, and, 5 elements. An interface layer can lie between the primary surface of the substrate and the gate dielectric layer. The interface layer can be at least approximately 1.8 nm in thickness.

As thickness of the gate dielectric is reduced, the relative contribution of the interface layer to the total capacitance is increased. Problems with the interface layer and attempts to reduce its thickness are known in the art. Attempts to reduce the thickness of the interface layer have focused on substrate preparation before forming the gate dielectric layer, and materials and formation techniques for the gate dielectric layer.

BRIEF DESCRIPTION OF THE DRAWINGS

The invention is illustrated by way of example and not limitation in the accompanying figures.

Figure 1:
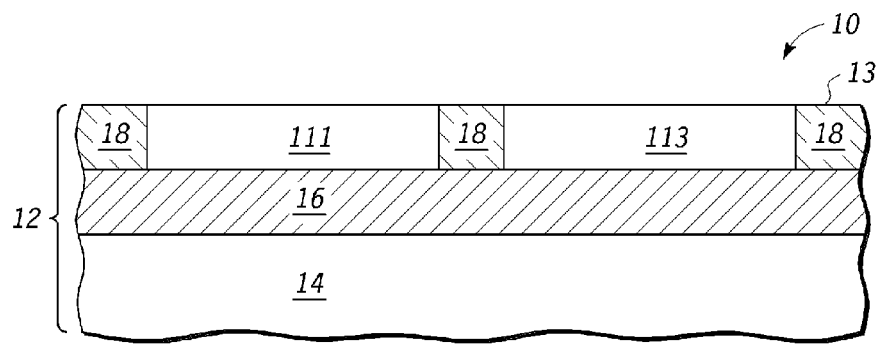
FIG. 1 includes an illustration of a cross-sectional view of a substrate after formation of field isolation and active regions.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A transistor structure of an electronic device can include a gate dielectric layer and a gate electrode. The gate electrode can include a first portion and a second portion wherein the first portion lies between the gate dielectric layer and the second portion. The first portion has a first work function, and the second portion has a second work function. The gate electrode has an effective work function closer in value to the second work function than the first work function. In a conventional transistor structure, the portion of the gate electrode closest to the gate dielectric layer substantially sets the work function for the gate electrode.

Unlike conventional wisdom, the inventors believe they have discovered that thickening of the interface layer between the substrate and the gate dielectric layer can occur during the gate electrode formation process. Using a surface portion of the gate electrode can help to reduce this thickening of the interface layer. In one embodiment, the surface portion can significantly reduce migration of an element or other material from another portion of the gate electrode, such as a portion that overlies the surface portion, before such element or other material can reach the interface layer. Still, the surface portion can be sufficiently thin, so that the effective work function of the gate electrode is closer to the work function of a material within another portion of the gate electrode, such as a portion that overlies the surface portion.

Before addressing details of embodiments described below, some terms are defined or clarified. Group numbers corresponding to columns within the Periodic Table of the elements use the "New Notation" convention as seen in the *CRC Handbook of Chemistry and Physics*, 81$^{st}$ Edition (2000).

The term "active region" is intended to mean part of a transistor structure through which carriers are designed to flow. The active region includes a channel region, a source region, a drain region, a source/drain region, or any combination thereof for one or more transistor structures.

The term "effective work function" is intended to mean the work function of a member or a structure that includes a plurality of layers or portions having different compositions, at an interface of interest. For example, within a transistor structure having a gate electrode and a channel region, when determining the effective work function of the gate electrode, the interface of interest is a surface of the gate electrode closest to the channel region, as a threshold voltage of the transistor structure is a function of the effective work function of the gate electrode.

The term "elemental transition metal" is intended to refer to a transition metal that is not part of a molecule that comprises at least two different elements. For example, Ti atoms that are not chemically bound to any other atoms are considered an elemental transition element; however Ti atoms within TiN are not considered to be an elemental transition metal.

The term "high-k," with respect to dielectric constant, is intended to mean a dielectric constant of at least 8.0.

The term "metal" or any of its variants is intended to refer to a material that includes an element that is (1) within any of Groups 1 to 12, or (2) within Groups 13 to 15, an element that is along and below a line defined by atomic numbers 13 (Al), 50 (Sn), and 83 (Bi), or any combination thereof. Metal does not include silicon or germanium.

The term "primary surface" is intended to mean a surface of a substrate or a portion thereof from which a transistor is subsequently formed. The primary surface may be an original surface of a base material before forming any electronic components or may be a surface from of the semiconductor layer that overlies the base material. For example, an exposed surface of a semiconductor layer of a semiconductor-on-insulator substrate can be a primary surface, and not the original surface of the base material.

The term "transistor structure" is intended to mean a structure that includes the active region and at least a gate electrode. A gate dielectric layer may or may not be part of the transistor structure.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes an illustration of a cross-sectional view of a portion of a substrate 12 of a partially formed electronic device 10, such as an integrated circuit. Substrate 12 can include a monocrystalline semiconductor wafer, a semiconductor-on-insulator wafer, a flat panel display (e.g., a silicon layer over a glass plate), or other substrate conventionally used to form electronic devices. In one embodiment, substrate 12 includes a base material 14, and an insulating layer 16.

Field isolation region 18 is formed using a conventional or proprietary technique, material or combination thereof. Field isolation region 18 can surround active regions 111 and 113. The upper surface of substrate 12 that includes the exposed surfaces of field isolation region 18, and active regions 111 and 113 is primary surface 13. In one embodiment, active region 111 can be a p-channel active region, and active region 113 can be an n-channel active region. One or more additional p-channel and n-channel active regions may be present but are not illustrated in FIG. 1.

Figure 2:
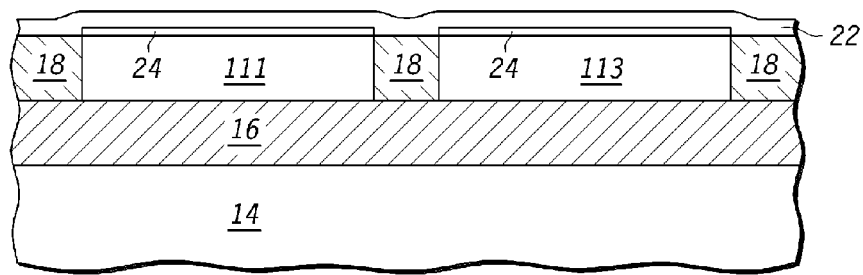
FIG. 2 includes an illustration of a cross-sectional view of the workpiece of FIG. 1 after formation of a gate dielectric layer.

Gate dielectric layer 22 can be formed over substrate 12 as illustrated in FIG. 2. Gate dielectric layer 22 can include a film of silicon dioxide, silicon nitride, silicon oxynitride, a high dielectric constant ("high-k") material, or any combination thereof. The high-k material can include $Hf_aO_b$, $Hf_aO_bN_c$, $Hf_aSi_bO_c$, $Hf_aSi_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing, Zr-containing, or Al-contain material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Gate dielectric layer 22 can have a thickness in a range of approximately 1 to approximately 20 nm. Gate dielectric 22 may be thermally grown using an oxidizing or nitridizing ambient, or deposited using a chemical vapor deposition ("CVD") technique, physical vapor deposition ("PVD") technique, or any combination thereof. In one embodiment, an atomic layer deposition process ("ALD") is used to form gate dielectric layer 22.

An interface layer 24 can be formed between the gate dielectric layer 22 and the substrate 12. The interface layer 24 can be in a range of approximately 0.3 nm to approximately 1.4 nm. Interface layer 24 can affect the electrical properties of the completed electronic device 10. A thicker interface layer can decrease the electrically measured capacitance in a transistor structure being compared to a substantially similar transistor structure with a thinner interface layer.

Figure 3:
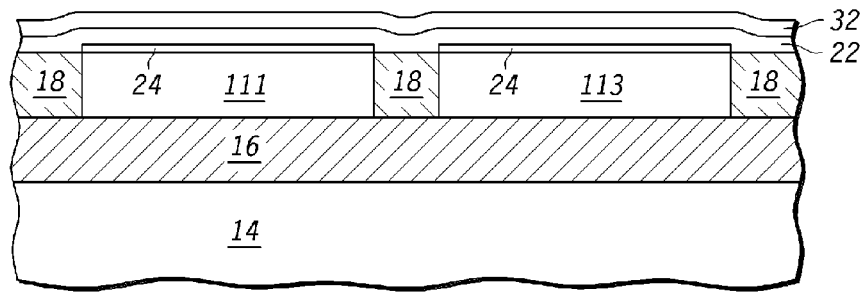
FIG. 3 includes an illustration of a cross-sectional view of a workpiece of FIG. 2 after formation of a portion of a p-channel gate electrode.

A gate electrode stack can include a portion of a plurality of layers. Layer 32 is formed over the gate dielectric layer 22 as illustrated in FIG. 3. Layer 32 can comprise a surface portion of a gate electrode in the electronic device 10. Layer 32 can be a conductive film including a metallic element. The metallic element can be a transition metal element and may include tantalum, titanium, molybdenum, ruthenium rhenium, palladium, osmium, iridium, platinum, or the like. Layer 32 may also include oxygen, nitrogen, silicon, carbon, or any combination there of. An exemplary material for layer 32 can include $Ti_aN_b$, $Ta_aN_b$, $Ti_aSi_bN_c$, $Ta_aSi_bN_c$, $Ti_aC_b$, $Ta_aC_b$, $Ti_aSi_bC_c$, or $Ta_aSi_bC_c$.

Layer 32 can have a thickness such that the effective work function of the gate electrode being formed is closer to a work function of a material within another portion of the gate electrode as compared to layer 32. Layer 32 may have a thickness not greater than 1.1 nm. Layer 32 can be formed by any technique previously described for formation of dielectric layer 22. Layer 32 can be formed using an atomic layer deposition ("ALD") process. Layer 32 may comprise 1, 2, 3, or 4 atomic layers. In one embodiment, layer 32 is formed prior to exposing gate dielectric layer 22 to air.

Figure 4:
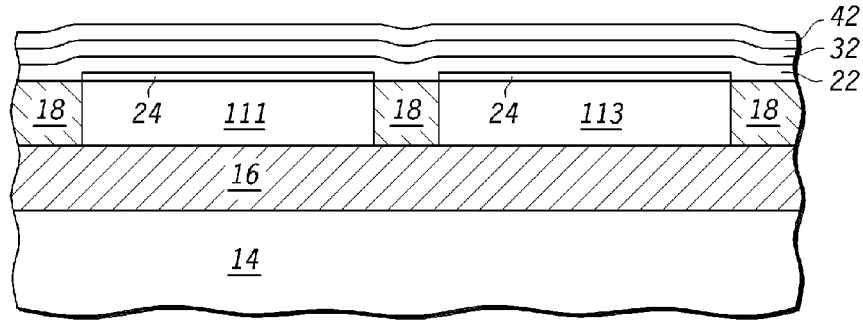
FIG. 4 includes an illustration of a cross-sectional view of the workpiece of FIG. 3 after another portion of the p-channel gate electrode.

Layer 42 is formed over layer 32 as illustrated in FIG. 4. Layer 42 can comprise a portion of a gate electrode in the electronic device 10. Although layer 32 is between layer 42 and gate dielectric layer 22, in one embodiment, layer 42 can substantially set the work function for the gate electrode in the electronic device 10. Layer 42 can include a metallic element, such as a transition metal element. The transition metal element can include an element from columns 6, 7, 8, 9, or 10 of the Periodic Table, such as molybdenum, ruthenium rhenium, palladium, osmium, iridium, platinum, or the like. In a particular embodiment, all metallic elements within layer 42 include only one or more transition metal elements. In another embodiment, layer 42 may include a second element that is silicon, oxygen, nitrogen, carbon or any combination thereof. Layer 42 can include $Mo_aO_b$, $Mo_aN_b$, $Mo_aSi_bN_c$, $Ru_aO_b$, $Ir_aO_b$, Ru, Ir, $Mo_aSi_bO_c$, $Mo_aSi_bO_cN_d$, $Mo_aHf_bO_c$, $Mo_aHf_bO_cN_d$, Pt, Pd, other transition metal containing material, or any combination thereof. Layer 42 can be in a range of approximately 5 to approximately 50 nm in thickness. In one embodiment, layer 42 is formed prior to exposing layer 32 to air.

Interface layer 24 can thicken in the presence of oxygen, nitrogen, carbon, silicon, or a combination thereof. Oxygen, nitrogen, carbon, silicon, or a combination thereof may be present before, during, or after the formation of layer 42. Layer 32 can help reduce the migration of oxygen, nitrogen, silicon, carbon, or a combination thereof to interface layer 24 before or during the formation of layer 42. Therefore, layer 32 may substantially limit the thickening of interface layer 24 to not greater than approximately 0.4 nm in one embodiment.

Figure 5:
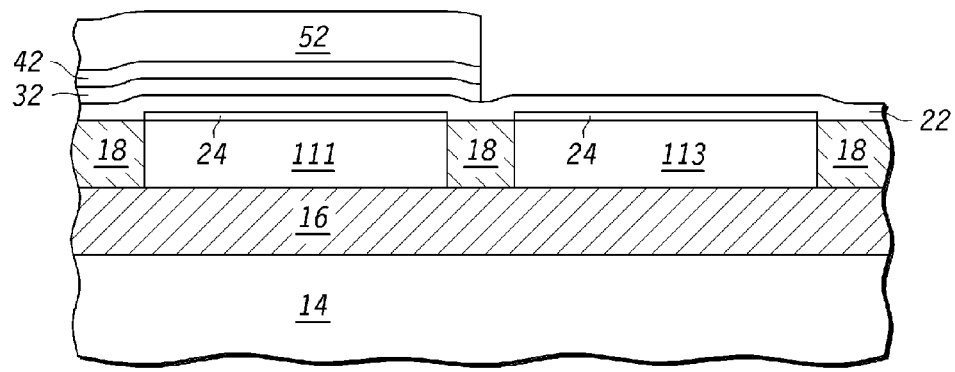
FIG. 5 includes an illustration of a cross-sectional view of the workpiece of FIG. 4 after removal of a portion of p-channel gate electrode overlying the n-channel active region.

A patterned layer 52 is formed over active region 111 as illustrated in FIG. 5. Patterned layer 52 can be formed by a conventional or proprietary, lithographic process. A portion of layers 32 and 42 that overlie active region 113 can be removed by conventional or proprietary process. In one embodiment (not illustrated), layer 32 is not removed. The patterned layer 52 can then be removed.

Figure 6:
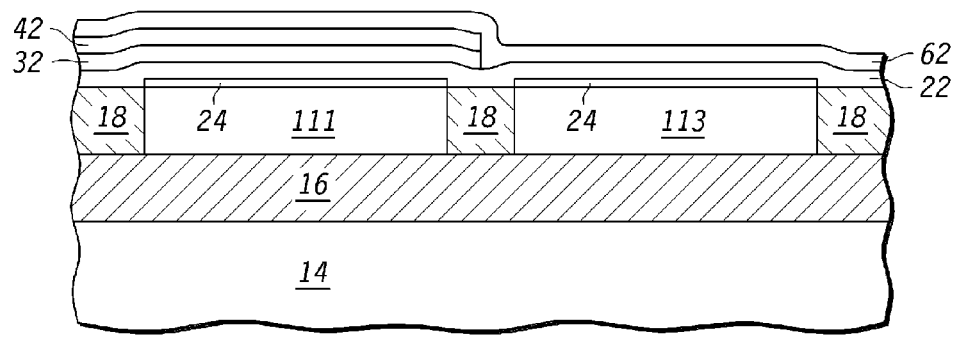
FIG. 6 includes an illustration of a cross-sectional view of the workpiece of FIG. 5 after formation of a gate electrode portion.
Figure 7:
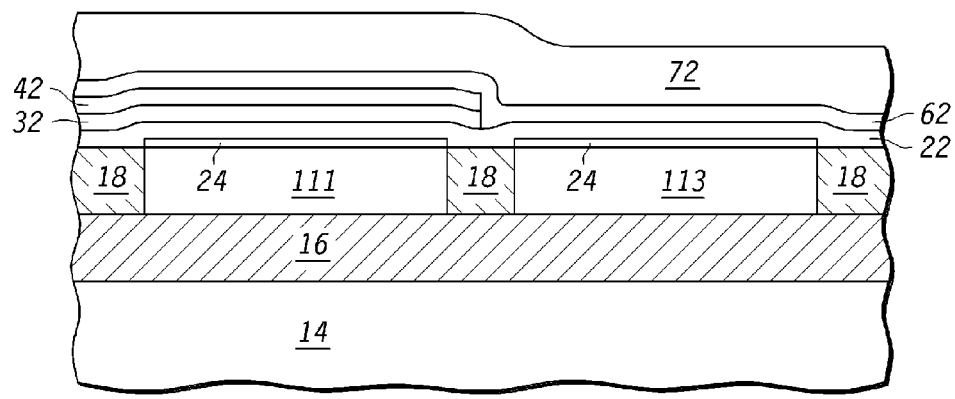
FIG. 7 includes an illustration of a cross-sectional view of the workpiece of FIG. 6 after formation of another gate electrode portion.

Layer 62 can optionally be formed over exposed portions of the workpiece as illustrated in FIG. 6. A portion of layer 62 can comprise a portion of a gate electrode in electronic device 10. In one embodiment, layer 62 can substantially set the work function for the subsequently formed transistor structure that includes active region 113. Layer 62 can include $Ta_aC_b$, $Ta_aSi_bN_c$, $Ta_aN_b$, $Ta_aSi_bC$, $Hf_aC_b$, $Nb_aC_b$, $Ti_aC_b$, $Ni_aSi_b$, or any other combination thereof. Layer 62 can be in a range of approximately 5 to approximately 50 nm in thickness and can be formed using a conventional or proprietary technique. In one embodiment, (not illustrated) a portion of layer 62 overlying active region 111 can optionally be removed.

Layer 72 is formed over the workpiece. A portion of layer 72 may comprise a portion of a gate electrode in electronic device 10. Layer 72 can be relatively more conductive as compared to any one or more of layers 32, 42, or 62, and can include a material such as amorphous silicon, polysilicon, a nitride, a metal-containing material, another suitable material, or any combination thereof. In one embodiment, the material can include tungsten, platinum, palladium, iridium, osmium, ruthenium, rhenium, indium-tin, indium-zinc, aluminum-tin, or any combination thereof. Layer 72 can have a thickness of in a range of approximately 30 to approximately 500 nm and be formed using a conventional or proprietary technique.

Figure 8:
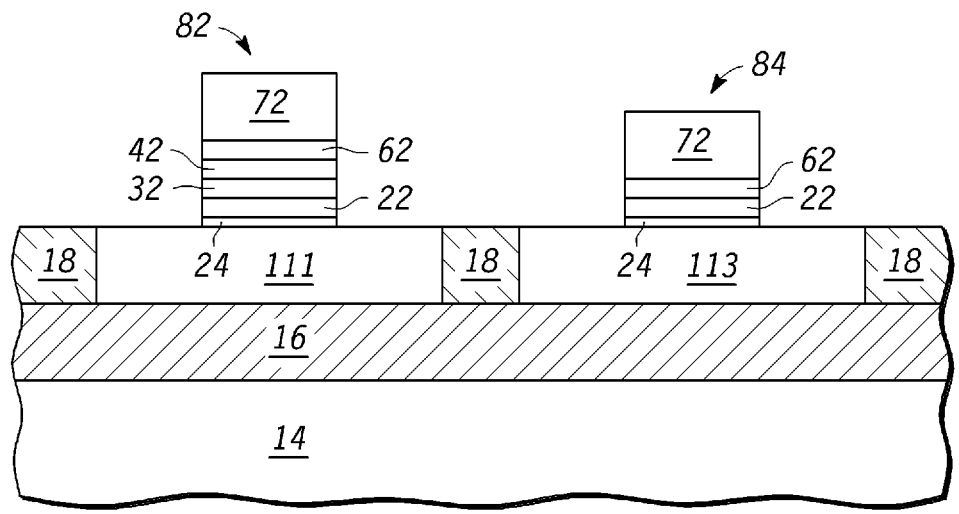
FIG. 8 includes an illustration of a cross-sectional view of the workpiece of FIG. 7 after formation of gate structures.

A patterned layer (not illustrated) is formed, and the n-channel and p-channel source/drain regions can be exposed during ion implantation, as illustrated in FIG. 8. A remaining portion of layers 32, 42, 62 and 72 can comprise gate electrodes 82 and 84 within active regions 111 and 113, respectively. A portion of interface layer 24 and gate dielectric layer 22 may also be removed. The patterned layer can then be removed.

Figure 9:
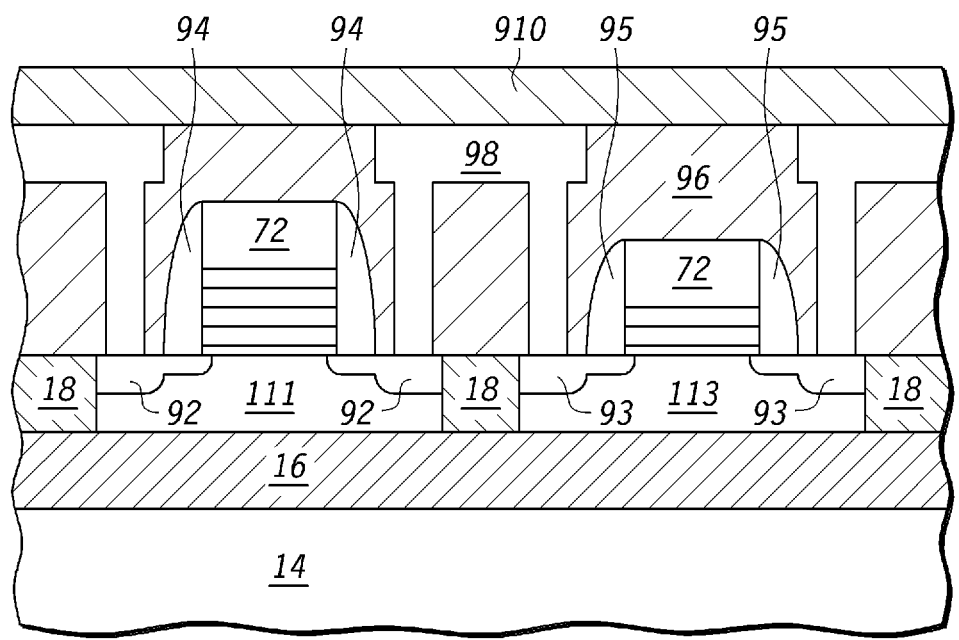
FIG. 9 includes an illustration of a cross-sectional view of the workpiece of FIG. 8 after fabrication of an electronic device is substantially completed.

Processing can be continued to form a substantially completed electronic device 10, as illustrated in FIG. 9. The substantially completed electronic device can include source/drain regions 92 and 93, sidewall spacers 94 and 95, one or more insulating layers 96, one or more conductive layers 98, and one or more encapsulating layers 910. Each of these regions, layers, and other features can be formed using one or more conventional or proprietary techniques.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a transistor structure. The transistor structure can include a gate dielectric layer and a gate electrode. The gate electrode can include a first portion and a second portion, wherein the first portion lies between the gate dielectric layer and the second portion. The first portion has a first work function, the second portion has a second work function, and the gate electrode has an effective work function closer in value to the second work function than the first work function.

In one embodiment of the first aspect, the gate dielectric layer includes a high-k gate dielectric material. In a particular embodiment, the gate dielectric layer includes an element from Group 3, 4, or 5 of the Periodic Table. In a more particular embodiment, the gate dielectric layer includes hafnium, zirconium, or any combination thereof.

In another embodiment of the first aspect, the first portion of the gate electrode includes a metallic element. In a particular embodiment, the metallic element is absent from both the gate dielectric layer and the second portion of the gate electrode. In still another embodiment the first portion of the gate electrode is not more than approximately 1.1 nm in thickness.

In yet another embodiment of the first aspect, the second portion of the gate electrode further includes a metallic element, and oxygen, nitrogen, silicon, carbon, or any combination thereof. In another embodiment, the electronic device can further include a substrate and an interface layer, wherein the interface layer lies between the substrate and the gate dielectric layer. In a particular embodiment, the interface layer is not greater than approximately 1.4 nm.

In a second aspect, a process for forming an electronic device can include forming a transistor structure. Forming the transistor structure can further include forming a gate dielectric layer over a substrate and forming a gate electrode including a first portion and a second portion. The first portion lies between the gate dielectric layer and the second portion. The first portion has a first work function, the second portion has a second work function, and the gate electrode has an effective work function closer in value to the second work function than the first work function.

In one embodiment of the second aspect, forming a gate dielectric layer includes performing an atomic layer deposition process. In another embodiment, the process further includes maintaining the substrate at a sub-atmospheric pressure between times of forming the gate dielectric and forming the gate electrode. In still another embodiment, forming the gate electrode includes forming the first portion of the gate electrode using an atomic layer deposition process. In a particular embodiment, forming the first portion of the gate electrode using atomic layer deposition deposits not more than 4 atomic layers. In another embodiment, the process further includes maintaining the substrate at a sub-atmospheric pressure between the times of forming the first and second portions of the gate electrode.

In another embodiment, forming the gate electrode comprises forming the second portion of the gate electrode, such that an interface layer lying between the substrate and the gate dielectric layer increases by not more that approximately 0.4 nm when forming the second portion. In a particular embodiment, forming the gate electrode comprises forming the first portion of the gate electrode, such that the first portion is less than 1.1 nm in thickness. In another particular embodiment, forming the second portion of the gate electrode comprises forming a metallic oxide, a metallic nitride, a metallic carbide, a metallic silicide, a metallic oxynitride, or any combination thereof.

In a third aspect, an electronic device can include a substrate, an interface layer, and a transistor structure. The transistor structure can include a high-k gate dielectric layer including an element from Group 3, 4, or 5 of the Periodic Table. The transistor structure can further include a gate electrode, including a first portion and a second portion wherein the first portion comprises a metallic element and lies between the gate dielectric layer and the second portion. The first portion of the gate electrode has a first work function, and the second portion of the gate electrode has a second work function. The second portion comprises a metallic element; and oxygen, nitrogen, silicon, carbon, or a combination thereof; and the gate electrode has an effective work function closer in value to the second work function than the first work function.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
   a first active region and a second active region;
   a gate dielectric layer over at least a portion of the first active region and at least a portion of the second active region; and
   a first layer formed over the first active region, wherein the first layer has a first work function;
   a second layer formed over the first layer and the first active region, wherein the second layer has a second work function;
   a third layer formed over the gate dielectric formed over the second active region;
   wherein a first gate electrode overlies the first active region, includes portions of the first and second layers, and has an effective work function closer in value to the second work function than the first work function; and
   a second gate electrode overlies the second active region and includes a portion of the third layer.

2. The electronic device of claim 1, wherein the gate dielectric layer includes an element from Group 3, 4, or 5 of the Periodic Table.

3. The electronic device of claim 2, wherein the gate dielectric layer comprises hafnium, zirconium, aluminum, or any combination thereof.

4. The electronic device of claim 1, wherein the first layer of the first gate electrode comprises a metallic element.

5. The electronic device of claim 4, wherein the metallic element is absent from both the gate dielectric layer and the second layer of the first gate electrode.

6. The electronic device of claim 1, wherein the first layer of the first gate electrode has a thickness of at least 2 atomic layers and not more than approximately 1.1 nm.

7. The electronic device of claim 1, wherein the second layer of the first gate electrode further comprises:
   a metallic element; and
   oxygen, nitrogen, silicon, carbon, or any combination thereof.

8. The electronic device of claim 1, further comprising a substrate and an interface layer, wherein the interface layer lies between the substrate and the gate dielectric layer.

9. The electronic device of claim 8, wherein the interface layer is not greater than approximately 1.4 nm.

10. An electronic device comprising:
    a first transistor structure including:
      a first gate dielectric layer; and
      a first gate electrode including a first portion and a second portion, wherein:
        the first portion lies between the first gate dielectric layer and the second portion;
        the first portion has a first work function;
        the second portion has a second work function; and
        the first gate electrode has a first effective work function closer in value to the second work function than the first work function; and
    a second transistor structure including:
      a second gate dielectric layer; and
      a second gate electrode including a third portion that abuts the second gate dielectric layer, wherein the third portion has a third work function, and the second gate electrode has a second effective work function that is substantially the third work function.

11. The electronic device of claim 10, wherein the first, second, and third portions have different compositions as compared to one another.

12. The electronic device of claim 11, wherein the first gate electrode further comprises a fourth portion overlying the second portion, wherein the fourth portion and the third portion of the second gate electrode have substantially a same composition.

13. The electronic device of claim 12, wherein:
    the first gate electrode further comprises a fifth portion overlying the fourth portion;
    the second gate electrode further comprises a sixth portion overlying the third portion; and
    the fifth and sixth portions have substantially a same composition.

14. The electronic device of claim 11, wherein the first portion of the first gate electrode has a thickness of at least 2 atomic layers.

15. The electronic device of claim 14, wherein the first portion of the first gate electrode is not more than approximately 1.1 nm in thickness.

16. The electronic device of claim 11, wherein substantially all of the second portion of the first gate electrode is spaced apart from the first gate dielectric.

17. The electronic device of claim 11, wherein the first gate dielectric layer includes an element from Group 3, 4, or 5 of the Periodic Table.

18. The electronic device of claim 11, wherein:
   the first portion of the first gate electrode comprises $Ti_aN_b$, $Ta_aN_b$, $Ti_aSi_bN_c$, $Ta_aSi_bN_c$, $Ti_aC_b$, $Ta_aC_b$, $Ti_aSi_bC_c$, or $Ta_aSi_bC_c$;
   the second portion of the first gate electrode comprises $Mo_aO_b$, $Mo_aN_b$, $Mo_aSi_bN_c$, $Ru_aO_b$, $Ir_aO_b$, Ru, Ir, $Mo_aSi_bO_c$, $Mo_aSi_bO_cN_d$, $Mo_aHf_bO_c$, $Mo_aHf_bO_cN_d$, Pt, Pd, or another transition metal containing material; and
   the third portion of the second gate electrode comprises $Ta_aC_b$, $Ta_aSi_bN_c$, $Ta_aN_b$, $Ta_aSi_bC$, $Hf_aC_b$, $Nb_aC_b$, $Ti_aC_b$, or $Ni_aSi_b$.

19. The electronic device of claim 18, wherein each of the first and second gate dielectric layers comprises $Hf_aC_b$, $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, or $Zr_aO_b$.

20. An electronic device comprising a transistor structure, the transistor structure comprising:
   an interface layer having a thickness no greater than approximately 0.4 nm;
   a high-k gate dielectric layer overlying the interface layer, wherein the high-k gate dielectric layer includes an element from Group 3, 4 or 5 of the Periodic Table; and
   a gate electrode, including a first portion and a second portion wherein:
      the first portion comprises a metallic element and lies between the gate dielectric layer and the second portion;
      the first portion has a first work function;
      the second portion has a second work function;
      the second portion comprises:
         a metallic element; and
         oxygen, nitrogen, silicon, carbon, or a combination thereof; and
      the gate electrode has an effective work function closer in value to the second work function than the first work function.

* * * * *